United States Patent [19]

Broadwater et al.

[11] Patent Number: 4,970,497

[45] Date of Patent: Nov. 13, 1990

[54] METHOD AND APPARATUS FOR SENSING THERMAL STRESS IN INTEGRATED CIRCUITS

[75] Inventors: Stuart P. Broadwater, White Hall; John Havlik, Sparks, both of Md.

[73] Assignee: Westinghouse Electric Corp., Pittsburgh, Pa.

[21] Appl. No.: 440,137

[22] Filed: Nov. 22, 1989

[51] Int. Cl.⁵ ............................................. G08B 17/06
[52] U.S. Cl. ..................................... 340/598; 307/310
[58] Field of Search ................. 340/598, 660; 307/310; 364/557; 73/204.26

[56] References Cited

U.S. PATENT DOCUMENTS

| | | | |
|---|---|---|---|
| 4,102,194 | 7/1978 | Eng | 340/598 X |
| 4,137,467 | 1/1979 | Plog | 340/598 X |
| 4,556,807 | 12/1985 | Yamada et al. | 307/310 X |
| 4,695,823 | 9/1987 | Vernon | 340/447 |
| 4,779,161 | 10/1988 | DeShazo, Jr. | 307/310 X |
| 4,884,443 | 12/1989 | Lee et al. | 73/204.26 X |

FOREIGN PATENT DOCUMENTS

2933874  2/1980  Fed. Rep. of Germany ...... 340/598

Primary Examiner—Joseph A. Orsino
Assistant Examiner—Thomas J. Mullen, Jr.
Attorney, Agent, or Firm—J. K. Williamson

[57] ABSTRACT

An integrated semiconductor chip includes, integral to its substrate, a thermal sensing circuit formed from an array of transistors connected together in a stacked array so as to multiply the inherent effects of temperature on output voltage. A series of gates is connected to the output of the transistor array. A reference voltage is applied to the transistor array, and the inherent temperature-variable output of the array is then applied to the gates. The gates change states at known temperatures and voltages, so that the digital state output of each gate indicates whether the substrate temperature is greater than or less than the switching temperature associated with that gate. By sensing gate output, the chip itself or an external device can determine the temperature of the substrate within a certain range. When the temperature is outside the safe operating range for the chip, the chip or an external device takes steps to prevent unsafe operation. The invention exploits the inherent temperature dependency of the current output of MOS transistors to form a temperature sensing circuit that is highly accurate and inexpensive.

12 Claims, 6 Drawing Sheets

FIG.1

FIG. 3
UTMP/INV

FIG. 4
UTMP/NAND1

FIG. 5
UTMP/NAND 2

FIG. 6
UTMP/NAND 3

METHOD AND APPARATUS FOR SENSING THERMAL STRESS IN INTEGRATED CIRCUITS

BACKGROUND OF THE INVENTION

This invention is generally concerned with alarm circuits for sensing thermal stresses in integrated circuit chips, and is specifically concerned with a circuit formed from an array of semiconductor devices already included within the geography of the chip that exploits the inherent variancy of the conductivity of such semiconductor components to temperature to form the alarm circuit.

Thermal stress has long been recognized as a significant problem in the operation of integrated semiconductor chips. These chips have limited operating temperature ranges, and may not function properly in very hot or very cold environments. In addition, the chips themselves use power and generate heat. Thus, even when the temperature of the environment is within the operating temperature range for the chip, the chip itself may be much hotter. This problem is exacerbated with newer chips that run much faster and thus generate more heat.

Thermal stress may prevent reliable operation of these chips. In many applications of such circuits, such as in the control systems of high-speed aircraft, any such unreliability, no matter how momentary, is unacceptable. Worse yet, thermal stress can destroy the chips. Operating a chip when its substrate is above a certain temperature may damage the miniaturized circuits to the extent that the chip will never operate properly again. However, the applicant has observed that if the chips are not operated while hot, they can survive exposure to much higher temperatures. Thus, the reliability of a particular circuit could be maintained if the operation of certain chips experiencing an overheated condition could be shut off and their work performed by alternative chips. As very large scale integrated circuit chips (such as the VLSICs used in new-generation microprocessors) and custom-designed, special purpose chips may cost hundreds or thousands of dollars each, significant savings could also be realized by preventing the operation of such chips in an overly hot environment.

In view of the foregoing, it would be desirable to have a highly effective and inexpensive means of monitoring chip temperature so that the chip could be turned off, an alarm sounded, etc. before excessively high or low operating temperatures caused the chip to operate unreliably or to become damaged. The environmental temperature of a chip could be monitored using temperature sensors disposed in a computer unit or attached to the chip case itself, but these methods would be expensive in that they require sensors separate from the chip, and additional monitoring hardware. In addition, methods using sensors would provide a less reliable indication of temperature. It is the temperature of the silicon substrate that determines the thermal stress thereon, but the other methods described here sense chip case temperature or the ambient air temperature in a computer unit. The temperature of the chip cases or surrounding air may not accurately reflect the temperature of the circuit substrate.

It is also well-known in the art that the flow of electrons and holes across semiconductor junctions varies with temperature. Generally, in digital electronics, the applicant has observed that the analog property of transistors is considered to be an operational flaw that must be designed around so that the resulting digital circuit is not affected by such temperature variations. Most commonly, the semiconductor chip engineer normally uses transistors in such digital circuits only at either a high or a low voltage (commonly 5 volts and zero volts) so that, regardless of temperature, the transistor will be "on" or "off," respectively.

SUMMARY OF THE INVENTION

The present invention advantageously exploits the temperature-variation property of transistors in a thermal stress circuit that comprises transistors already integrated into a silicon chip that is used to sense the thermal stress on the chip. Because they are physically part of the substrate of the chip, the transistors sense the temperature on the substrate and thus provide highly accurate measurements. Because the interconnections between the transistors necessary to form the thermal sensing circuit are very easily added by standard photo processes, the stress sensing circuit can be added to the chip with virtually no increase in fabrication costs.

Therefore, it is a general object of the present invention to provide a new and improved integrated semiconductor chip having a thermal stress sensing circuit which uses the inherent variance with temperature of transistor conductivity to produce a temperature-indicating output signal.

It is a further object of the present invention to provide a new and improved integrated semiconductor chip which changes its operation in response to operating temperature.

It is another object of the present invention to provide a new and improved integrated semiconductor chip having a thermal stress sensing circuit which produces a temperature-indicating output signal, wherein the signal is monitored by a series of inverters or gates which change states at known voltages to produce a digital indication of the relationship of the signal voltage to the known voltage.

Finally, it is an object of the present invention to provide a standard cell for use on computer aided chip engineering work stations to incorporate a temperature sensing circuit.

Other objects of the present invention will be apparent to those skilled in the art after examination of the specification and drawing figures.

These objects and others are achieved in a preferred embodiment by providing an integrated semiconductor chip which includes, integral to its substrate, an array of temperature sensitive transistors connected so as to multiply the effects of temperature on output voltage, and a series of inverters or gates. A reference voltage is applied to the transistor array, and the temperature-variable output of the array is then applied to the inverters or gates. The inverters or gates change states at known temperatures and voltages, so that the digital state output of each inverter or gate indicates whether the substrate temperature is greater than or less than the switching temperature associated with that inverter or gate. By polling the inverters or gates, the chip itself or an external device can determine the temperature of the substrate within a certain range. When the temperature is outside the safe operating range for the chip, the chip itself or an external device takes steps to prevent unsafe operation.

BRIEF DESCRIPTION OF THE DRAWINGS

The design and operation of the present invention can best be understood by reference to the detailed description in conjunction with the following drawing figures.

DETAILED DESCRIPTION OF A PREFERRED EMBODIMENT

Figure 1:
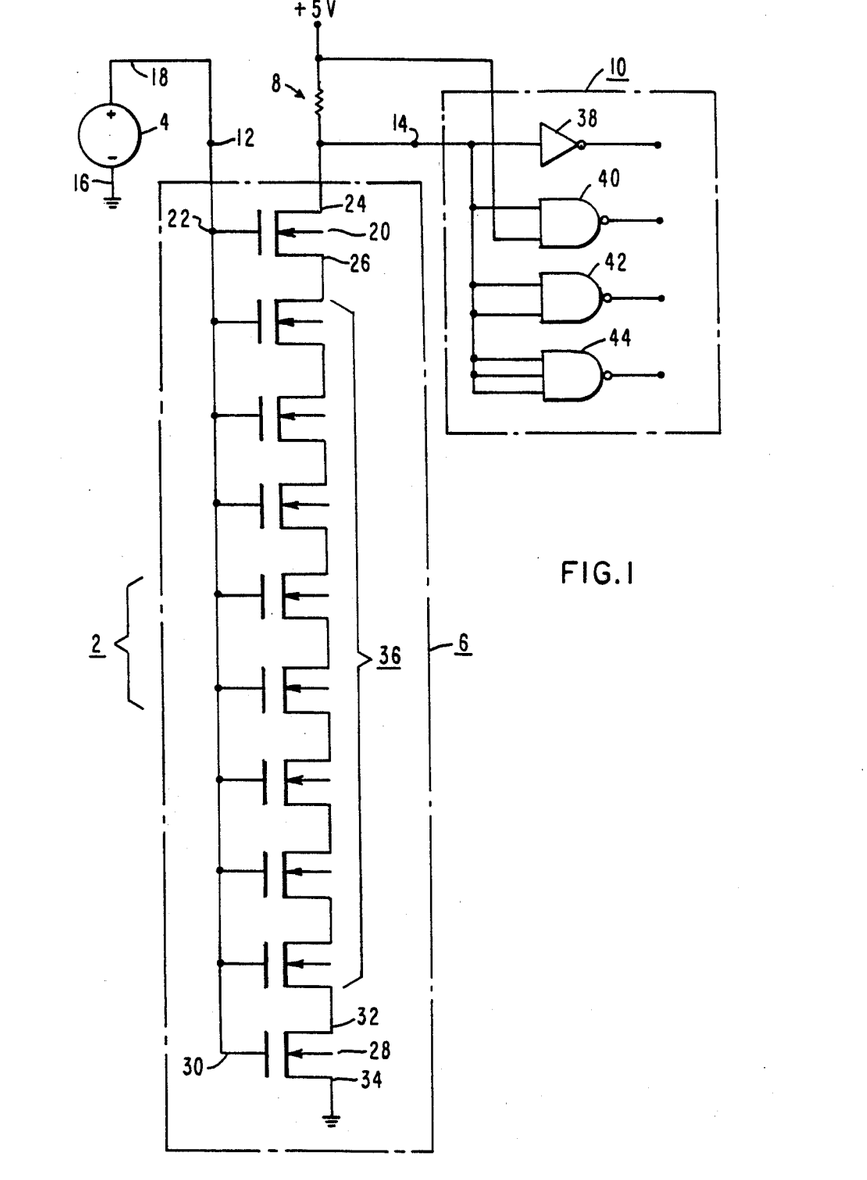
FIG. 1 is a schematic diagram of an embodiment of the thermal stress sensing circuit of the present invention.

Referring first to FIG. 1, the circuit of the present invention is shown generally at 2. The circuit 2 comprises reference voltage input 4, thermal stress sensing circuit 6, pullup resistor 8, and gate array 10. The thermal stress sensing circuit 6 has an input 12 and an output 14.

The reference voltage input 4 is preferably a fixed DC source with a voltage output selected in conjunction with the selection of gates for gate array 10 as will be explained in more detail later. The reference voltage input 4 has a negative terminal 16 and a positive terminal 18. The negative terminal 16 is connected to ground, while the positive terminal 18 is connected to the input 12 of thermal stress sensing circuit 6.

As shown in FIG. 1, thermal stress sensing circuit 6 comprises ten serially connected NMOS field-effect transistors whose conductivity is sensitive to temperature. This configuration is preferred because the effect of temperature on conductivity of the field-effect transistors 6 increases cumulatively as more transistors are added. Ten transistors are adequate to provide a useful level of temperature sensitivity, although it will be understood that a single transistor or any number of transistors could be used if appropriate output sensing means were provided. Also, temperature-sensitive semiconductor devices other than field-effect transistors could be used. For example, ordinary transistors or a series of diodes could be used in the circuit. The transistors of the thermal stress sensing circuit 6 are formed by standard processes on the substrate of the chip that is to be monitored for thermal stress. The thermal stress sensing circuit 6 is preferably formed near the center of the chip so that the temperature measured is representative of the general chip temperature.

The circuitry of thermal stress sensing circuit 6 will now be described in detail. The thermal stress sensing circuit 6 includes a first transistor 20 having a gate terminal 22, a drain terminal 24, and a source terminal 26. A last transistor 28 has a gate 30, drain 32, and source 34, and eight intermediate transistors 36 are shown in the circuit, each having a source, drain, and gate terminal.

The gate 22 of the first transistor 20, the gate 30 of the last transistor 28, and the gates of each of the intermediate transistors 36 are all connected to the input 12 of thermal stress sensing circuit 6. The drain 24 of the first transistor 20 is connected to the output 14 of thermal stress sensing circuit 6, while the source 26 of the first transistor 20 is connected solely to the drain of one of the intermediate transistors 36. The source 34 of the last transistor 28 is connected to ground, and the drain 32 of the last transistor 28 is solely connected to the source of an intermediate transistor 36. Each intermediate transistor 36, except for the intermediate transistor 36 connected to first transistor 20, has its drain connected in a one-to-one relationship with the source of another intermediate transistor 36. Thus, the thermal stress sensing circuit 6 comprises a stacked plurality of field effect transistors with their controlling gates connected to a common input and their drains and sources chained together between the output 14 and ground. The stacked configuration has been experimentally determined to produce the maximum temperature/output correlation.

The pullup resistor 8 is connected between a five volt DC source and the output 14 of thermal stress sensing circuit 6. Resistor 8 is preferably an 8.2K Ohm resistor and may be miniaturized and placed inside the chip case. Alternatively, the output 14 could be brought out to an external pin of the chip package and the resistor 8 could be connected externally to the chip package. Alone, the thermal stress sensing circuit 6 as shown is basically a current device, with the output 14 being a variable current draw. The pullup resistor 8 acts with the thermal stress sensing circuit 6 to form a voltage divider, so that output 14 becomes a voltage output.

Figure 2:
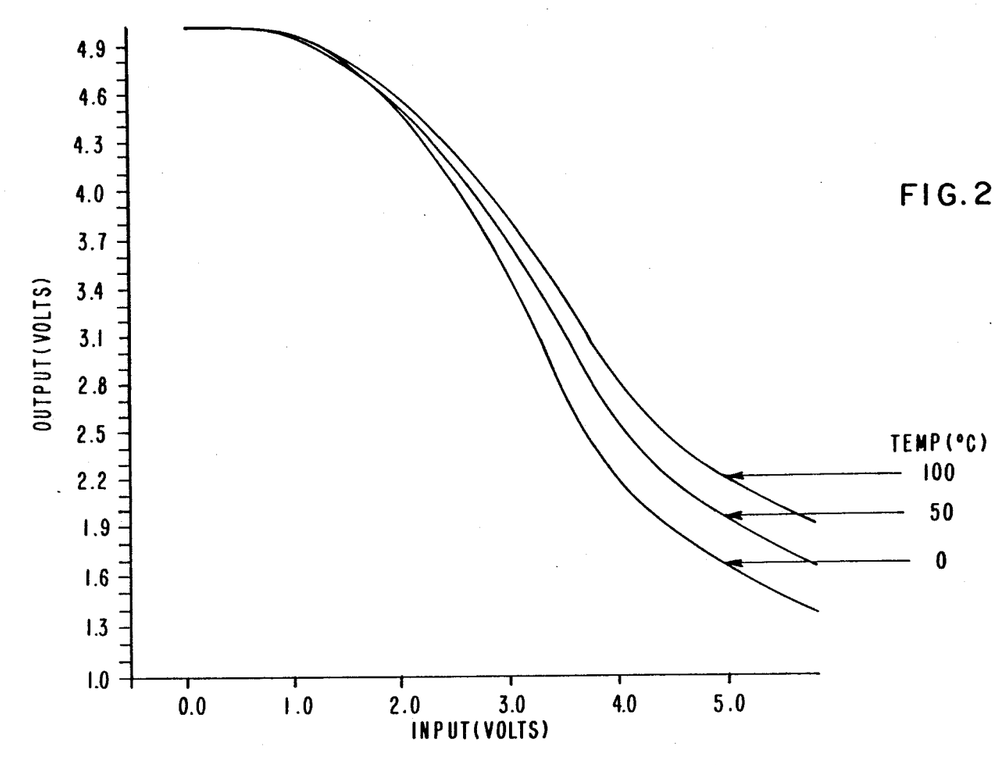
FIG. 2 is a graphical representation of the thermal stress sensing circuit output voltage as a function of input voltage at various temperatures.
Figure 3:
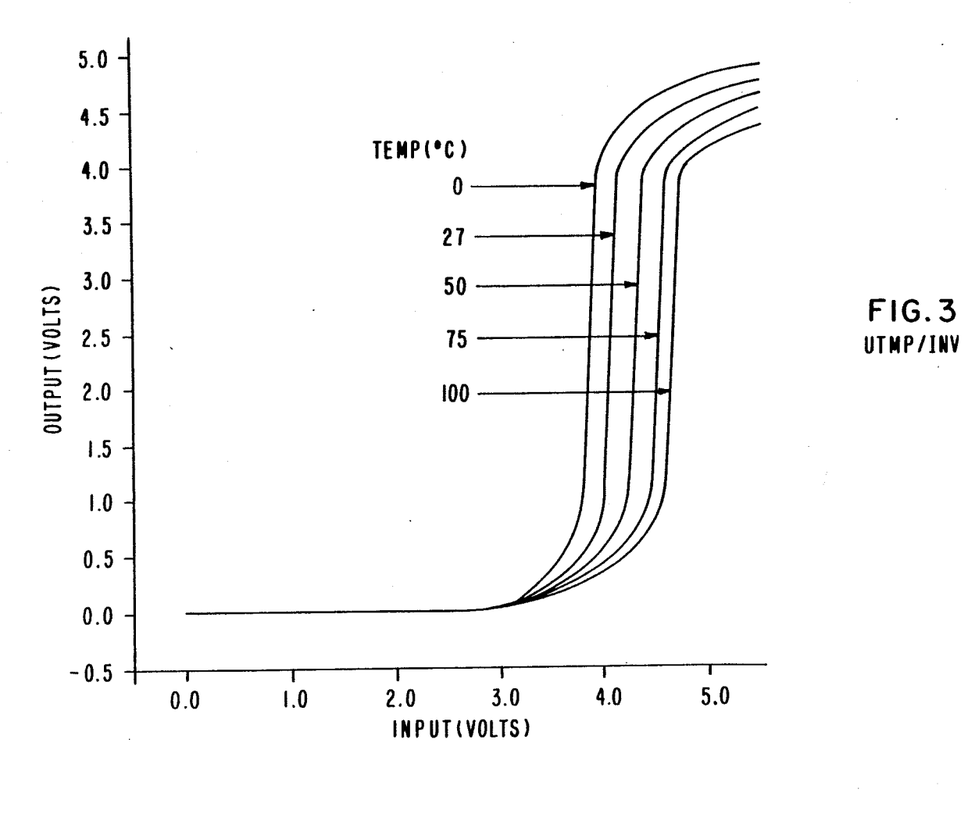
FIG. 3 is a graphical representation of the output voltage of an inverter (used as an output device for the thermal stress sensing circuit) as a function of input voltage and temperature.
Figure 4:
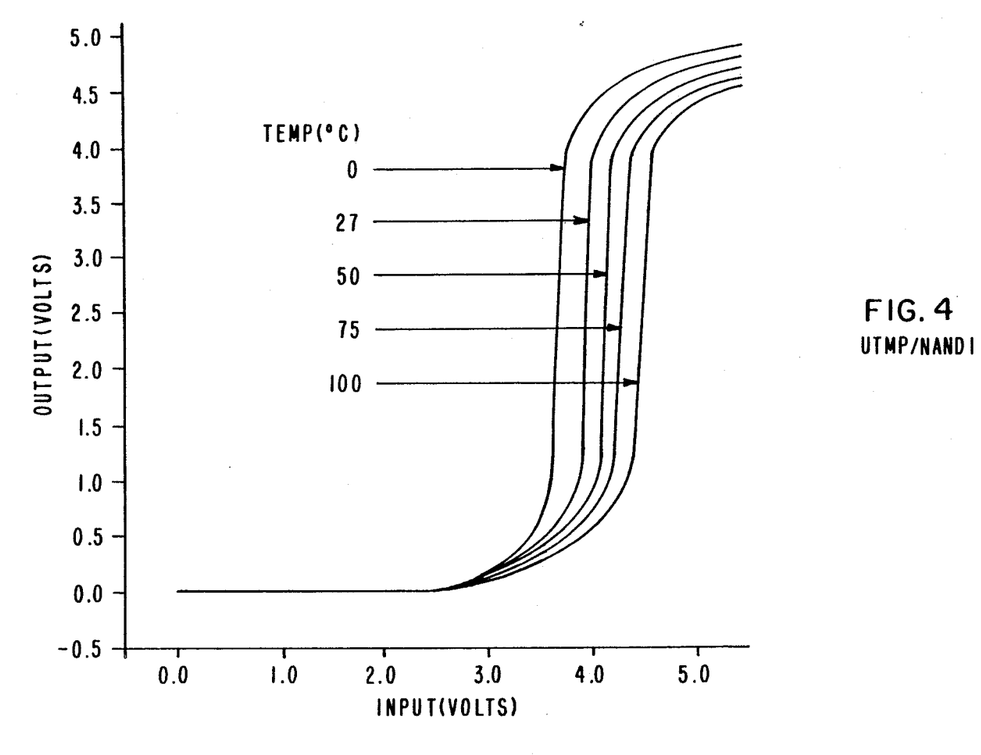
FIG. 4 is a graphical representation of the output voltage of a first NAND gate (used as an output device for the thermal stress sensing circuit) as a function of input voltage and temperature.
Figure 5:
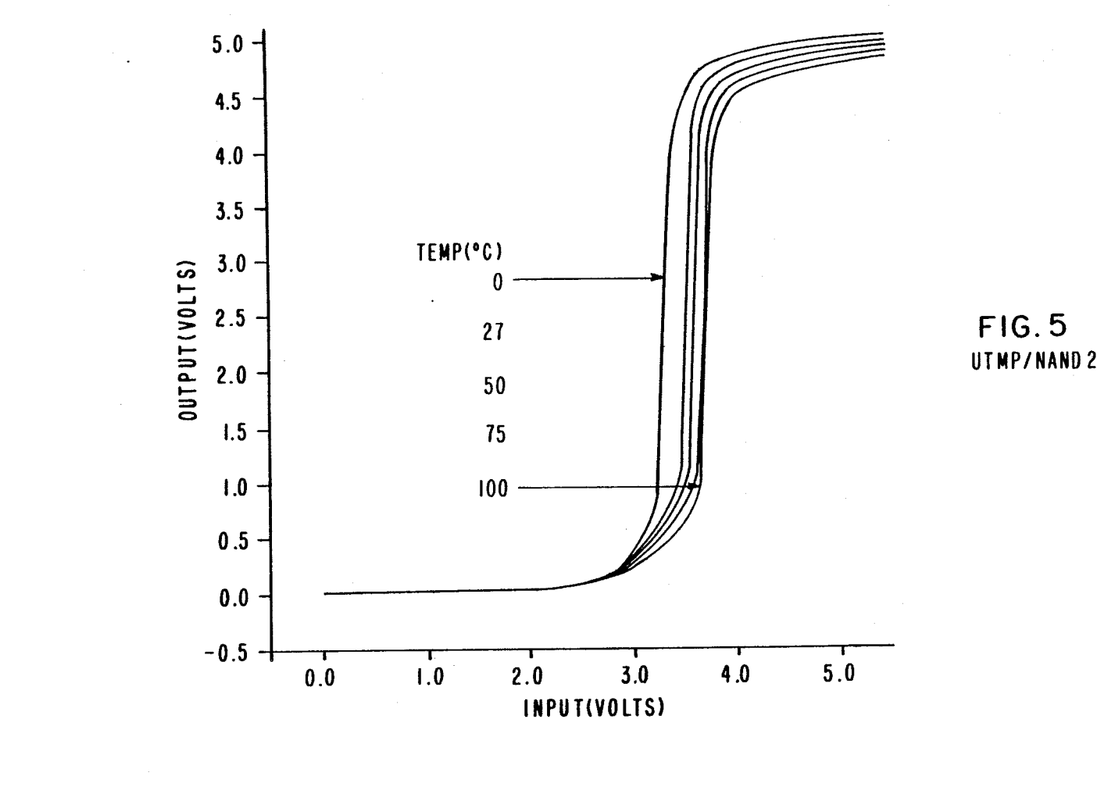
FIG. 5 is a graphical representation of the output voltage of a second NAND gate (used as an output device for the thermal stress sensing circuit) as a function of input voltage and temperature.
Figure 6:
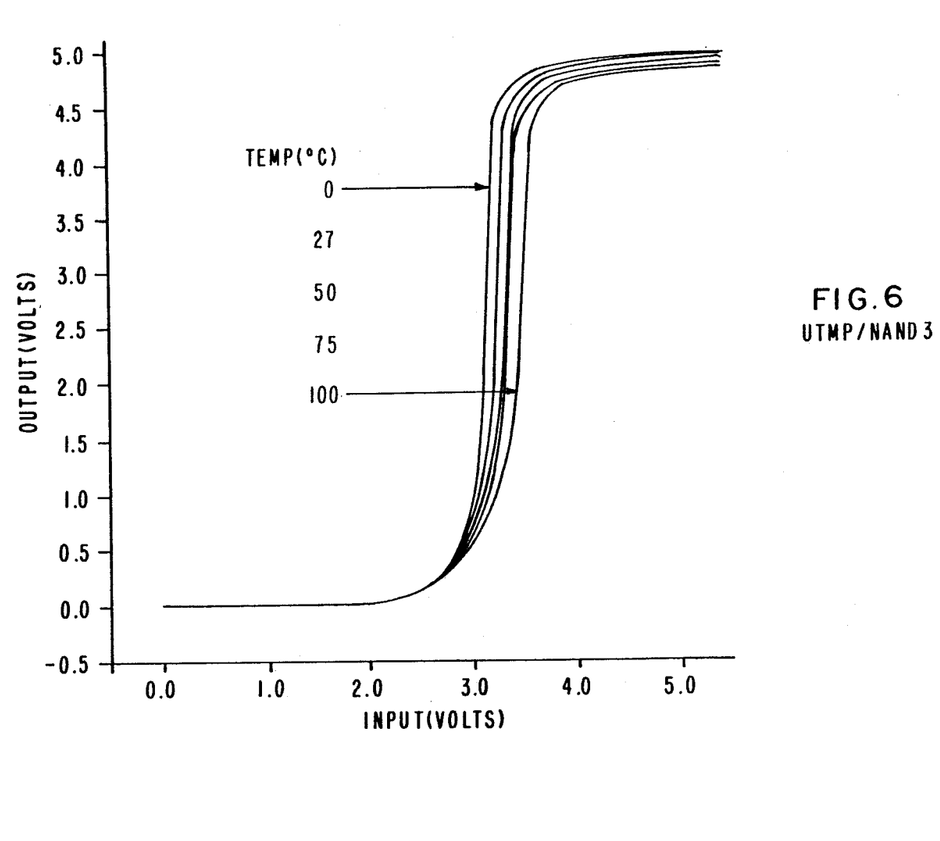
FIG. 6 is a graphical representation of the output voltage of a third NAND gate (used as an output device for the thermal stress sensing circuit) as a function of input voltage and temperature.

In FIG. 2, the output voltage 14 of the thermal stress sensing circuit 6 is shown as a function of input voltage and temperature. Referring again to FIG. 1, gate array 10 is used to process this output 14, converting it to digital signals representative of the temperature range encompassing the chip substrate temperature. The gate array 10 is preferably integrated into the substrate in the same region as the thermal stress sensing circuit 6 so that the gate array 10 will experience the same thermal effects as sensing circuit 6. In this way, the desired output at particular temperatures can be assured. The gate array 10 or substitute circuitry performing the same function could also be provided externally, particularly if the output 14 is brought out to an external terminal of the chip package as suggested previously.

The gate array 10 comprises standard library gates, including inverter 38, NAND gate 40, NAND gate 42, and NAND gate 44. These gates 38, 40, 42, and 44 are chosen so that each has a different temperature setpoint; that is, each gate will change output state in response to a different voltage input, correlating to a temperature in excess of a selected value. FIGS. 3, 4, 5, and 6 show output response as a function of input voltage and temperature for a preferred set of gates 38, 40, 42, and 44 respectively. The input voltage to each gate in gate array 10 in this case will be the output voltage 14 of thermal stress sensing circuit 6.

In operation, the resistance of the transistors 20, 28, and 36 of thermal stress sensing circuit 6 to the flow of current will increase as the temperature of the chip substrate increases. This increase in resistance will increase the output voltage 14 as shown in FIG. 2. As the temperature (and thus output voltage 14) increases, the gate 44 will change its output state from "high" to "low". If the temperature continues to increase, the output states of gates 42, 40, and 38 will change sequentially from high to low as the temperature increases. Thus, the output states of the gates 38, 40, 42, and 44 provide an indication of a temperature range which contains the actual chip substrate temperature. A low output for one of the gates 38, 40, 42, and 44 indicates that substrate temperature is greater than the setpoint temperature of that gate.

The connections of the temperature signal outputs of the gates in gate array 10 are not shown in the drawings, because the connections will depend on the desired mode of operation. These outputs can be used to perform a variety of functions. A number of functional examples will be provided here, but those skilled in the art will immediately recognize further possibilities within the scope of the invention. As one example, the signals could be used to alert a maintenance or central control processor which might divert processing functions to a backup system, turn the chip off, reduce power to the chip, or reduce the duty cycle of chip use by periodically inhibiting system access to the chip until chip temperature drops. The signals could also be used as an input to an alarm controller, which would operate in a well-known fashion in response to the signal outputs, activating a signal means and thereby alerting personnel that a chip is operating at excessive temperatures. Chip temperature data could be logged for service indications and for use in failure analysis. Further, the signals could be used internally within the subject chip to achieve the same results. For example, the chip might have internal circuitry that would reduce the operating duty cycle or inhibit chip selection if substrate temperature is excessive. Finally, while the present specification has primarily discussed solutions to the more commercially significant problem of overheating in chips, the inventors also contemplate applying the circuits and concepts presented herein to prevent errors or damage from chip operation at low temperatures, such as those encountered in polar environments or outer space.

The value of the reference voltage input 4 and the gates 38, 40, 42, and 44 are selected together, with reference to the transfer function of thermal stress sensing circuit 6 as shown in FIG. 2, and with reference to the operating capabilities of the chip, so that the output states of the gates switch at desired chip temperatures. For example, if a chip will be destroyed by operation above 120 degrees Centigrade, one of the gates should be chosen to switch slightly below this temperature so that chip operation can be inhibited in response to the gate output.

The gate array 10 is a simple method of providing a digital signal when the temperature of the substrate passes out of a desired range. However, it will be recognized that a single gate or any number of gates could be used within the scope of the invention, depending on the precision required for chip temperature information. Also, numerous other means of generating a digital output reflective of temperature could be used within the scope of the present invention. For example, if it is necessary in a particular application to know the substrate temperature, output 14 could be connected to an analog-to-digital converter which would produce a digital representation of the voltage output. This digital representation could then be translated into an accurate substrate temperature measurement.

We claim:

1. An improved integrated semiconductor chip of the type including a plurality of semiconductive devices integrated onto a common substrate wherein the conductivity of said semiconductive devices inherently varies with temperature, comprising a thermal stress sensing circuit, said circuit having an input and an output and being formed from at least some of said semiconductive devices that are interconnected in such a way as to amplify the inherent variance with temperature of the conductivity of said devices, wherein the input of the stress sensing circuit is connected to a fixed voltage source, and the voltage output of the said circuit varies with temperature, wherein the output of the stress sensing circuit is connected to a control means that reduces power to the integrated semiconductor chip when the voltage output of the said stress sensing circuit reaches a selected level.

2. The device of claim 1 wherein the control means operates to stop power to the integrated semiconductor chip when the voltage output of the said stress sensing circuit reaches a selected level.

3. An improved integrated semiconductor chip of the type including a plurality of semiconductive devices integrated onto a common substrate wherein the conductivity of said semiconductive devices inherently varies with temperature, comprising a thermal stress sensing circuit, said circuit having an input and an output and being formed from at least some of said semiconductive devices that are interconnected in such a way as to amplify the inherent variance with temperature of the conductivity of said devices, wherein the input of the stress sensing circuit is connected to a fixed voltage source, and the voltage output of the said circuit varies with temperature, further comprising duty cycle control means for responding to the voltage output of the stress sensing circuit, said duty cycle control means operating to reduce the operating duty cycle of the chip when the voltage output reaches a selected level.

4. An improved integrated semiconductor chip of the type including a plurality of semiconductive devices integrated onto a common substrate wherein the conductivity of said semiconductive devices inherently varies with temperature, comprising a thermal stress sensing circuit, said circuit having an input and an output and being formed from at least some of said semiconductive devices that are interconnected in such a way as to amplify the inherent variance with temperature of the conductivity of said devices, wherein the input of the stress sensing circuit is connected to a fixed voltage source, and the voltage output of the said circuit varies with temperature, wherein the thermal stress sensing circuit comprises a transistor array.

5. The device of claim 4 wherein the said transistor array comprises a stacked plurality of field effect transistors, each transistor having a gate, drain, and source terminal, the stack including a first transistor and a last transistor, wherein the gate of each transistor is connected to a common reference voltage, the source of each transistor other than the last transistor is solely connected to the drain of one transistor other than the first transistor, the source of the last transistor is connected to ground, and the drain of the first transistor is connected through a voltage pull-up means to a voltage source, the output voltage of the thermal stress sensing circuit being sensed at the drain of the said first transistor.

6. A thermal stress measurement system comprising thermal responding means integral with an integrated semiconductor chip for varying a voltage in response to temperature changes, and voltage sensing means for sensing the voltage output of the thermal responding means and providing a signal responsive to said voltage output, wherein the signal provided by the said voltage sensing means provides an indication of the temperature on the chip, further comprising control means for responding to the signal provided by the voltage sensing means, said control means operating to reduce power to the integrated semiconductor chip when the signal indicates that the temperature on the chip is outside a defined operating range.

7. The system of claim 6 wherein the control means operates to stop power to the chip when the signal indicates that the temperature on the chip is outside a defined operating range.

8. A thermal stress measurement system comprising thermal responding means integral with an integrated semiconductor chip for varying a voltage in response to temperature changes, and voltage sensing means for sensing the voltage output of the thermal responding means and providing a signal responsive to said voltage output, wherein the signal provided by the said voltage sensing means provides an indication of the temperature on the chip, further comprising duty cycle control means for responding to the signal provided by the voltage sensing means, said duty cycle control means operating to reduce the operating duty cycle of the chip when the signal indicates that the temperature on the chip exceeds a defined threshold.

9. A thermal stress measurement system comprising thermal responding means integral with an integrated semiconductor chip for varying a voltage in response to temperature changes, and voltage sensing means for sensing the voltage output of the thermal responding means and providing a signal responsive to said voltage output, wherein the signal provided by the said voltage sensing means provides an indication of the temperature on the chip, wherein the thermal responding means comprises a transistor array.

10. The system of claim 9 wherein the said transistor array comprises a stacked plurality of field effect transistors, each transistor having a gate, drain, and source terminal, the stack including a first transistor and a last transistor, wherein the gate of each transistor is connected to a common reference voltage, the source of each transistor other than the last transistor is solely connected to the drain of one transistor other than the first transistor, the source of the last transistor is connected to ground, and the drain of the first transistor is connected through a voltage pull-up means to a voltage source, the output voltage of the thermal responding means being sensed at the drain of the said first transistor.

11. The system of claim 9 wherein the voltage sensing means comprises one or more logic gates which change their output voltage state in response to known input voltages.

12. The system of claim 9 wherein the voltage sensing means comprises an analog-to-digital converter which senses the voltage produced by the thermal responding means and produces a digital signal representative of chip temperature.

* * * * *